United States Patent
Weng et al.

(10) Patent No.: US 11,087,655 B2
(45) Date of Patent: Aug. 10, 2021

(54) GATE DRIVING SIGNAL DETECTION CIRCUIT, DETECTION METHOD, AND DISPLAY DEVICE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Zuwei Weng, Beijing (CN); Weize Xu, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/649,595

(22) PCT Filed: Jun. 10, 2019

(86) PCT No.: PCT/CN2019/090497
§ 371 (c)(1),
(2) Date: Mar. 20, 2020

(87) PCT Pub. No.: WO2019/242514
PCT Pub. Date: Dec. 26, 2019

(65) Prior Publication Data
US 2020/0279516 A1    Sep. 3, 2020

(30) Foreign Application Priority Data
Jun. 22, 2018   (CN) .......................... 201810651982.9

(51) Int. Cl.
*G09G 3/32*     (2016.01)
*G09G 3/00*     (2006.01)
(Continued)

(52) U.S. Cl.
CPC ........... *G09G 3/006* (2013.01); *G09G 3/3266* (2013.01); *G01R 31/00* (2013.01); *G09G 2310/08* (2013.01); *G09G 2330/12* (2013.01)

(58) Field of Classification Search
CPC ................. G09G 3/3266; G09G 3/006; G09G 2300/0408; G09G 2310/06;
(Continued)

(56) References Cited

U.S. PATENT DOCUMENTS 6,204,836 B1    3/2001   Yamazaki et al.
2003/0075718 A1  4/2003   Jang et al.

FOREIGN PATENT DOCUMENTS

CN    1412735 A    4/2003
CN    102629440 A   8/2012
(Continued)

OTHER PUBLICATIONS

First Office Action for Chinese Application No. 201810651982.9, dated Dec. 13, 2019, 9 Pages.
(Continued)

*Primary Examiner* — Michael J Eurice
(74) *Attorney, Agent, or Firm* — Brooks Kushman P.C.

(57) ABSTRACT

A gate driving signal detection circuit, a method, and a display device are provided, the gate driving signal detection circuit includes a switch sub-circuit and a test signal line, during a blank time period and an interval time period, the switch sub-circuit controls writing of a clock signal output by a clock signal line into the test signal line; during a output time period of each stage of gate driving signal, when a potential of the gate driving signal is an effective level, the switch sub-circuit controls to establish a connection between a corresponding gate driving signal output terminal and the test signal line, when the potential of the gate driving signal is an ineffective level, the switch sub-circuit controls to
(Continued)

disconnect the connection between the corresponding gate driving signal output terminal and the test signal line.

13 Claims, 8 Drawing Sheets

(51) Int. Cl.
*G09G 3/3266* (2016.01)
*G01R 31/00* (2006.01)

(58) Field of Classification Search
CPC .......... G09G 2310/08; G09G 2230/00; G09G 2330/08; G09G 2330/12; G02F 1/1309; G02F 1/13454; G02F 2001/136254; H01L 27/124; G01R 31/00; G01R 31/2836; G11C 29/32
See application file for complete search history.

(56) References Cited

FOREIGN PATENT DOCUMENTS

| CN | 104183225 A | 12/2014 |
|---|---|---|
| CN | 104299547 A | 1/2015 |
| CN | 104505045 A | 4/2015 |
| CN | 105355163 A | 2/2016 |
| CN | 105513518 A | 4/2016 |
| CN | 106504708 A | 3/2017 |
| CN | 106875877 A | 6/2017 |
| CN | 107025870 A | 8/2017 |
| CN | 107038989 A | 8/2017 |
| CN | 107068033 A | 8/2017 |
| CN | 108831360 A | 11/2018 |
| KR | 20100066654 A | 6/2010 |

OTHER PUBLICATIONS

International Search Report and Written Opinion for Application No. PCT/CN2019/090497, dated Sep. 2, 2019, 11 Pages.
1$^{st}$ Chinese Office Action English Translation.
International Search Report and Written Opinion English Translation.
CN1412735A English Abstract and U.S. Equivalent U.S. Pub. No. 2003/0075718.
CN102629440A English Abstract and Machine Translation.
CN104183225A English Abstract and Machine Translation.
CN104299547A English Abstract and Machine Translation.
CN104505045A English Abstract and Machine Translation.
CN105355163A English Abstract and Machine Translation.
CN105513518A English Abstract and Machine Translation.
CN106504708A English Abstract and Machine Translation.
CN106875877A English Abstract and Machine Translation.
CN107025870A English Abstract and Machine Translation.
CN107038989A English Abstract and Machine Translation.
CN107068033A English Abstract and Machine Translation.
CN108831360A English Abstract and Machine Translation.
KR20100066654A English Abstract and Machine Translation.

GATE DRIVING SIGNAL DETECTION CIRCUIT, DETECTION METHOD, AND DISPLAY DEVICE

CROSS-REFERENCE TO RELATED APPLICATIONS

This application is the U.S. national phase of PCT Application No. PCT/CN2019/090497 filed on Jun. 10, 2019, which claims priority to Chinese Patent Application No. 201810651982.9 filed on Jun. 22, 2018, which are incorporated herein by reference in their entireties.

TECHNICAL FIELD

The present disclosure relates to the field of display driving technology, and in particular to a gate driving signal detection circuit, a gate driving signal detection method, and a display device.

BACKGROUND

An Active Matrix/Organic Light Emitting Diode (AMOLED) display panel includes a plurality of rows and columns of pixel circuits. In a case that an image is displayed, progressive scanning is generally used. A gate line controls pixels to be turned on or turned off. In order to reduce the number of components and reduce production cost, in recent years, a gate driving circuit has been gradually developed to be directly fabricated on the display panel. Gate Driver on Array (GOA) is such a very important technology, a gate driving circuit may be directly fabricated on an array substrate, and a gate driving signal is provided for a pixel circuit.

Although GOA circuit may achieve high integration of the circuits in the display panel, it also causes some problems in test of the display panel. For example, to ensure normal operation of the display panel, it is necessary to perform fault detection to the gate driving signal on the gate line. The fault detection method in the related art is generally to derive the gate driving signal output by a last-stage gate driving unit included in GOA circuit to a test pad, to detect the gate driving signal, and to determine whether GOA circuit works normally by analyzing a detection signal. However, the derived detection signal in the related art is only the gate driving signal output by the last-stage gate driving unit, and gate driving signals output by other stages of the gate driving units are not derived. Therefore, even if it is known that the last-stage gate driving unit does not output a normal driving signal, a specific location of a fault of GOA circuit may not be identified accurately, which is not conducive to further analyze cause of the fault of the fault gate driving unit.

SUMMARY

The present disclosure provides a gate driving signal detection circuit, applied to a gate driving circuit, including multiple stages of gate driving units, wherein each gate driving unit includes a gate driving signal output terminal, the gate driving signal detection circuit includes a switch sub-circuit and a test signal line, the test signal line is connected to a clock signal line and multiple stages of gate driving signal output terminals respectively through the switch sub-circuit.

During a blank time period set between two adjacent scanning periods and an interval time period between output time periods of two adjacent gate driving signals set in the scanning period, the switch sub-circuit controls writing of a clock signal output by the clock signal line into the test signal line;

During a output time period of each stage of gate driving signal, when a potential of the gate driving signal is an effective level, the switch sub-circuit controls to establish a connection between the corresponding gate driving signal output terminal and the test signal line, when the potential of the gate driving signal is an ineffective level, the switch sub-circuit controls to disconnect the connection between the corresponding gate driving signal output terminal and the test signal line.

Optionally, the gate driving signal detection circuit further includes a detection sub-circuit; wherein, the detection sub-circuit is connected to the test signal line to detect a signal on the test signal line, and detects a fault of the gate driving unit according to the signal on the test signal line.

Optionally, the detection sub-circuit includes a test pad, an oscilloscope, and a fault detection unit, wherein, The test pad is electrically connected to the test signal line;

The oscilloscope is electrically connected to the test pad, and is configured to display a waveform of the signal on the test signal line;

The fault detection unit is configured to detect the fault of the gate driving unit according to the waveform.

Optionally, the switch sub-circuit includes N+1 switch transistors, N is the number of stages of the gate driving signal output terminals in the gate driving circuit; N is a positive integer;

A gate of an n-th switch transistor and a first electrode of the n-th switch transistor are both connected to an n-th stage gate driving signal output terminal, a second electrode of the n-th switch transistor is connected to the test signal line; n is a positive integer less than or equal to N;

A gate of an (N+1)-th switch transistor and a second electrode of the (N+1)-th switch transistor are both connected to the test signal line, a first electrode of the (N+1)-th switch transistor is connected to the clock signal line.

Optionally, the effective level is a low level, the ineffective level is a high level, the N+1 switch transistors are all p-type transistors; or, The effective level is a high level, the ineffective level is a low level, the N+1 switch transistors are all n-type transistors.

The disclosure further provides a gate driving signal detection method, applied to the gate driving signal detection circuit described above, the scanning period includes a plurality of output time periods of gate driving signal which are sequentially arranged, the output time period of the gate driving signal corresponds to each stage of the gate driving signal;

During the scanning period, the interval time period is set between the output time periods of the two adjacent gate driving signals; the blank time period is set between the two adjacent scanning periods; the gate driving signal detection method includes:

during the blank time period and the interval time period, controlling, by the switch sub-circuit, the writing of the clock signal output by the clock signal line into the test signal line and disconnecting a connection between a corresponding stage of the gate driving signal output terminal and the test signal line;

during a output time period of a corresponding gate driving signal included in the scanning period, controlling, by the switch sub-circuit, to disconnect a connection between the clock signal line and the test signal line, wherein, when a potential of a corresponding stage of the gate driving signal is an effective level, the switch sub-circuit controls to establish a connection between the corresponding stage of the gate driving signal output terminal and the test signal line, so that a potential of the signal in the test signal line is an effective level, and when the potential of the corresponding stage of the gate driving signal is an ineffective level, the switch sub-circuit controls to disconnect the connection between the corresponding stage of the gate driving signal output terminal and the test signal line, so that a potential of the signal in the test signal line is an ineffective level.

Optionally, the gate driving signal detection circuit further includes a detection sub-circuit, the gate driving signal detection method further includes: the detection sub-circuit detecting a signal on the test signal line, and detecting a fault of the gate driving unit according to the signal on the test signal line.

Optionally, the detection sub-circuit includes a test pad, an oscilloscope, and a fault detection unit, the test pad is electrically connected to the test signal line; the step of detecting, by the detection sub-circuit, a signal on the test signal line and a fault of the gate driving unit according to the signal on the test signal line includes:

displaying a waveform of the signal on the test signal line by the oscilloscope;

detecting, by the fault detection unit, the fault of the gate driving unit according to the waveform.

Optionally, the fault gate driving unit is determined by a time length from a measurement start time to a missing pulse waveform.

The present disclosure further provides a display device, including the gate driving signal detection circuit described above.

Optionally, the display device described in the present disclosure further includes a display substrate and a gate driving circuit disposed on the display substrate;

The gate driving circuit includes multiple stages of the gate driving units; the gate driving unit includes a gate driving signal output terminal;

The switch sub-circuits in the gate driving signal detection circuit are connected to multiple stages of the gate driving signal output terminals included in the gate driving circuit, respectively.

DETAILED DESCRIPTION

The technical solutions of embodiments of the present disclosure will be clearly and completely described below with reference to the drawings of embodiments of the present disclosure. Apparently, the described embodiments are only some embodiments of the present disclosure, but are not all the embodiments. Based on the embodiments of the present disclosure, all other embodiments derived by a person of ordinary skill in the art without any creative efforts shall fall within the scope of the present disclosure.

The transistors adopted in all embodiments of the present disclosure may be thin film transistors or field effect transistors or other devices with the same characteristics. In the embodiment of the present disclosure, in order to distinguish two electrodes of the transistor other than the gate, one of the electrodes is referred to as a first electrode, and the other electrode is referred to as a second electrode. In practice, the first electrode may be a drain, and the second electrode may be a source; or, the first electrode may be a source, and the second electrode may be a drain.

Figure 1:
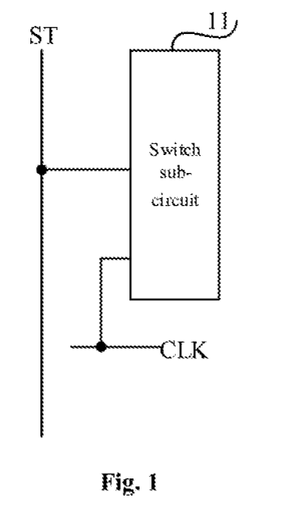
FIG. 1 is a structural diagram of a gate driving signal detection circuit described in an embodiment of the present disclosure.

A gate driving signal detection circuit described in the embodiment of the present disclosure is configured to detect a fault of a gate driving unit included in a gate driving circuit. As shown in FIG. 1, the gate driving signal detection circuit includes a switch sub-circuit 11 and a test signal line ST.

The switch sub-circuit 11 is connected to a clock signal line CLK, the test signal line ST, and multiple stages of gate driving signal output terminals (not shown in FIG. 1) included in the gate driving circuit, respectively. During a blank time period set between two adjacent scanning periods and an interval time period between output time periods of two adjacent gate driving signals set in the scanning period, the switch sub-circuit is configured to control writing of a clock signal output by the clock signal line CLK into the test signal line ST, so as to reset a potential of the test signal line ST to an ineffective level;

During the output time period of the corresponding gate driving signal, when a potential of the corresponding gate driving signal is an effective level, the switch sub-circuit 11 is configured to establish a connection between the corresponding stage of the gate driving signal output terminal and the test signal line ST, when the potential of the corresponding stage of the gate driving signal is an ineffective level, the connection between the corresponding stage of the gate driving signal output terminal and the test signal line ST is disconnected.

The gate driving signal detection circuit described in the embodiment of the present disclosure only needs to use a single test signal line ST, a single clock signal line CLK, and the switch sub-circuit 11, to effectively detect the gate driving signal output by each stage of the gate driving unit, that is, it is determined whether the each stage of the gate driving unit has a fault according to the potential of the signal on the test signal line ST during a output time period of each gate driving signal.

The gate driving signal detection circuit described in the embodiment of the present disclosure may accurately identify the specific location of the faulty gate driving unit while effectively detecting the gate driving signal, and has the advantages of small space, high reliability, easy operation, and high detection efficiency.

Compared with the related art, the gate driving signal detection circuit, the gate driving signal detection method and the display device described in the present disclosure are capable of detecting the gate driving signal output by the each stage of the gate driving unit by using a single test signal line, a single clock signal line and the switch sub-circuit, that is, it is determined whether the each stage of the gate driving unit has a fault according to the potential of the signal on the test signal line during the output time period of each gate driving signal. The embodiment of the present disclosure may accurately identify the specific location of the faulty gate driving unit while effectively detecting the gate driving signal, and has the advantages of small space, high reliability, easy operation, and high detection efficiency.

In practice, the scanning period includes a plurality of output time periods of gate driving signal which are sequentially arranged, the output time period of the n-th stage gate driving signal corresponds to the n-th stage gate driving signal, n is an integer less than or equal to N; during the scanning period, the interval time period is set between output time periods of the two adjacent gate driving signals; the blank time period is set between the two adjacent scanning periods.

In some embodiments, the gate driving circuit includes multiple stages of gate driving units, the gate driving unit includes a gate driving signal output terminal, and one stage of the gate driving units corresponds to a row of the gate lines, and the corresponding stage of the gate driving signal output terminal included in the corresponding stage of the gate driving unit is connected to the corresponding row of the gate line; When the corresponding stage of the gate driving signal is in an effective level, the thin film transistor (the gate of the thin film transistor is connected to the corresponding row of the gate line) included in the pixel units disposed on the corresponding row on the display substrate is turned on, when the corresponding stage of the gate driving signal is in an ineffective level, the thin film transistor (the gate of the thin film transistor is connected to the corresponding row of the gate line) included in the pixel units disposed on the corresponding row on the display substrate is turned off.

For example, when the thin film transistor is a p-type transistor, the effective level is a low level and the ineffective level is a high level; when the thin film transistor is an n-type transistor, the effective level is a high level, and the ineffective level is a low level.

In practice, the gate driving circuit may be a gate on array (GOA) circuit, but is not limited thereto.

Figure 2:
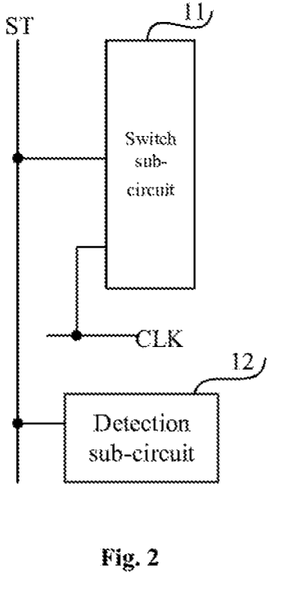
FIG. 2 is a structural diagram of a gate driving signal detection circuit described in another embodiment of the present disclosure.

Specifically, as shown in FIG. 2, based on the embodiment of the gate driving signal detection circuit shown in FIG. 1, the gate driving signal detection circuit described in the embodiment of the present disclosure may further include a detection sub-circuit 12;

The detection sub-circuit 12 is connected to the test signal line ST, and is configured to detect a signal on the test signal line ST and detect a fault of the gate driving unit according to the signal on the test signal line ST.

In practice, the gate driving signal detection circuit described in the embodiment of the present disclosure further includes the detection sub-circuit 12, so as to detect a specific location of the fault of the gate driving unit according to the signal on the test signal line ST.

Figure 3:
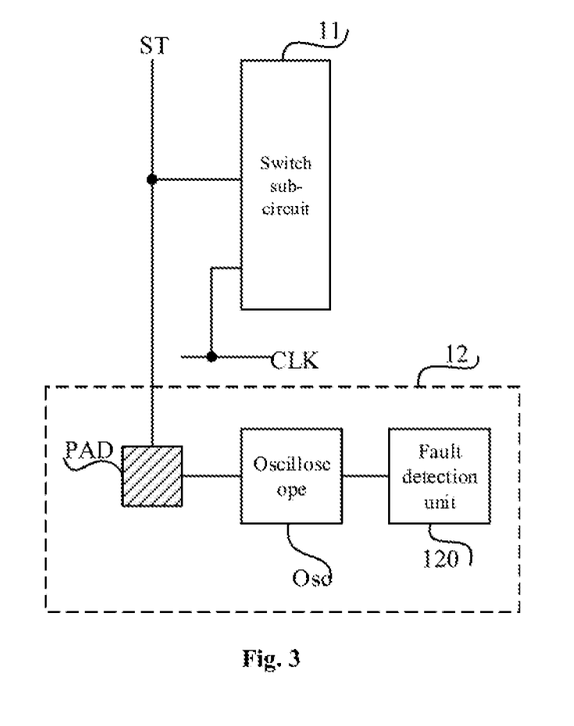
FIG. 3 is a structural diagram of a gate driving signal detection circuit described in yet another embodiment of the present disclosure.

In practice, as shown in FIG. 3, based on the embodiment of the gate driving signal detection circuit shown in FIG. 2, the detection sub-circuit 12 may include a test pad PAD, an oscilloscope Osc, and a fault detection unit 120.

The test pad PAD is electrically connected to the test signal line ST;

The oscilloscope Osc is electrically connected to the test pad PAD, and is configured to display a waveform of the signal on the test signal line ST;

The fault detection unit 120 is connected to the oscilloscope Osc, and is configured to detect the fault of the gate driving unit according to the waveform.

In the embodiment shown in FIG. 3, the test signal line may be led to the test pad PAD, and the signal on the test signal line ST is detected by an approach of oscilloscope Osc pin detection (pin test pad PAD).

In practice, the test pad PAD may be disposed on a display panel, a flexible printed circuit (FPC), or a printed circuit board (PCB).

Specifically, the switch sub-circuit 11 may include N+1 switch transistors, N is the number of stages of the gate driving signal output terminal in the gate driving circuit; N is a positive integer;

A gate of an n-th switch transistor and a first electrode of the n-th switch transistor are both connected to an n-th stage gate driving signal output terminal, a second electrode of the n-th switch transistor is connected to the test signal line; n is a positive integer less than or equal to N;

A gate of an (N+1)-th switch transistor and a second electrode of the (N+1)-th switch transistor are both connected to the test signal line, a first electrode of the (N+1)-th switch transistor is connected to the clock signal line.

In some embodiments, stages of the gate driving signal output terminal included in the gate driving circuit are connected to the test signal line ST through corresponding switch transistors, respectively, the clock signal line is also connected to the test signal line ST through the (N+1)-th switch transistor.

According to a specific embodiment, the effective level is a low level, the ineffective level is a high level, and the N+1 switch transistors are all p-type transistors.

According to another specific embodiment, the effective level is a high level, the ineffective level is a low level, and the N+1 switch transistors are all n-type transistors.

Figure 4:
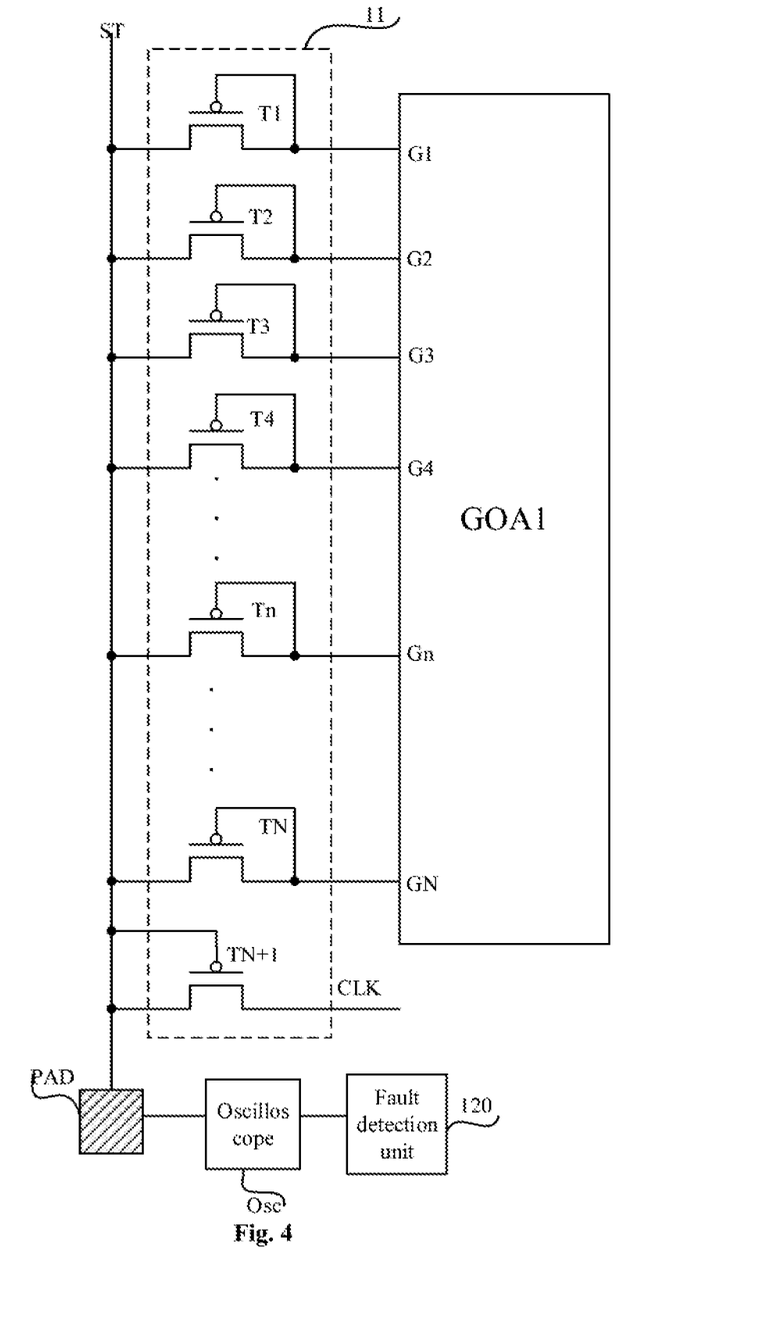
FIG. 4 is a circuit diagram of a specific embodiment of a gate driving signal detection circuit described in the present disclosure.

As shown in FIG. 4, a specific embodiment of the gate driving signal detection circuit described in the present disclosure includes a switch sub-circuit 11, a test signal line ST, and a detection sub-circuit.

The detection sub-circuit includes a test pad PAD, an oscilloscope Osc, and a fault detection unit 120.

The test pad PAD is electrically connected to the test signal line ST.

The oscilloscope Osc is electrically connected to the test pad PAD, and is configured to display a waveform of the signal on the test signal line ST.

The fault detection unit 120 is connected to the oscilloscope Osc, and is configured to detect the fault of the gate driving unit according to the waveform.

The switch sub-circuit 11 includes N+1 switch transistors, N is the number of stages of the gate driving signal output terminal in the gate driving circuit; N is a positive integer.

In FIG. 4, T1 is a first switch transistor included in the switch sub-circuit 11, T2 is a second switch transistor included in the switch sub-circuit 11, T3 is a third switch transistor included in the switch sub-circuit, T4 is a fourth switch transistor included in the switch sub-circuit 11, Tn is an n-th switch transistor included in the switch sub-circuit 11, TN is an N-th switch transistor included in the switching sub-circuit 11, and TN+1 is an (N+1)-th switch transistor included in the switch sub-circuit 11; N is a positive integer, and n is a positive integer less than or equal to N.

In FIG. 4, the gate driving circuit is labeled GOA1, a first-stage gate driving signal output by GOA1 is labeled G1, a second-stage gate driving signal output by GOA1 is labeled G2, a third-stage gate driving signal output by GOA is labeled G3, a fourth-stage gate driving signal output by GOA1 is labeled G4, an n-th stage gate driving signal output by GOA1 is labeled Gn, and an N-th stage gate driving signal output by GOA1 is labeled GN.

A gate of T1 and a source of T1 are both connected to G1, and a drain of T1 is connected to the test signal line ST;

A gate of T2 and a source of T2 are both connected to G2, and a drain of T2 is connected to the test signal line ST;

A gate of T3 and a source of T3 are both connected to G3, and a drain of T3 is connected to the test signal line ST;

A gate of T4 and a source of T4 are both connected to G4, and a drain of T4 is connected to the test signal line ST;

A gate of Tn and a source of Tn are both connected to Gn, and a drain of Tn is connected to the test signal line ST;

A gate of TN and a source of TN are both connected to GN, and a drain of TN is connected to the test signal line ST;

A gate of TN+1 and a drain of TN+1 are both connected to the test signal line ST, and a source of TN+1 is connected to the clock signal line CLK.

In the specific embodiment shown in FIG. 4, all transistors are described as examples of the p-type transistors, but not limited thereto. In the specific embodiment shown in FIG. 4, the effective level is a low level, and the ineffective level is a high level.

Figure 5:
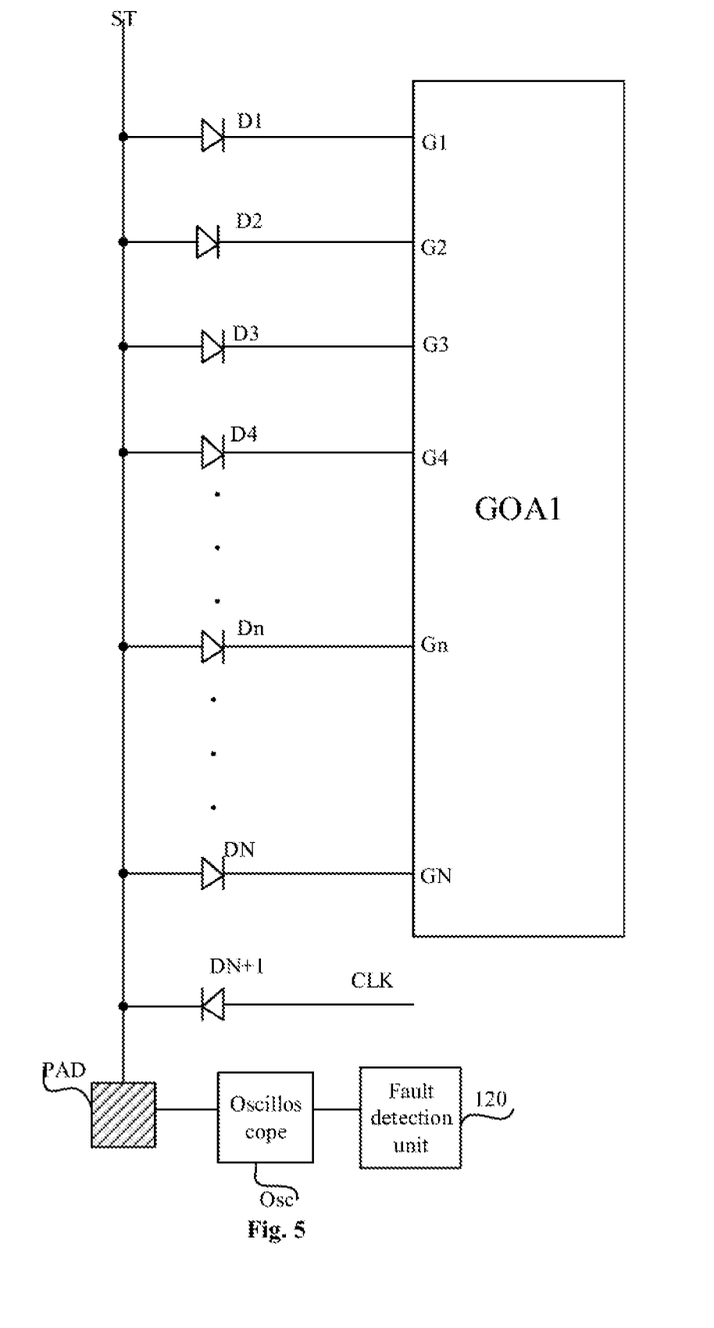
FIG. 5 is an equivalent circuit diagram of the specific embodiment of the gate driving signal detection circuit shown in FIG. 4 of the present disclosure.

FIG. 5 is an equivalent circuit diagram of FIG. 4, wherein a first diode D1 is equivalent to T1, a second diode D2 is equivalent to T2, D3 is equivalent to T3, D4 is equivalent to T4, and an n-th diode Dn is equivalent to Tn, an N-th diode DN is equivalent to TN, and an (N+1)-th diode DN+1 is equivalent to TN+1.

Figure 6:
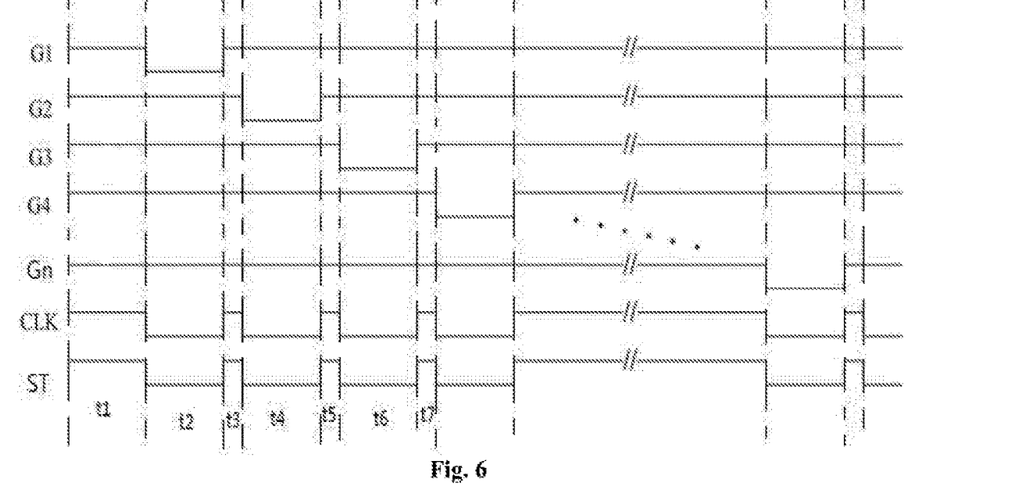
FIG. 6 is a timing diagram of each signal when each stage of gate driving signal output by a GOA1 is normal in the specific embodiment of the gate driving signal detection circuit shown in FIG. 4.

FIG. 6 is a timing diagram of each signal when each stage of gate driving signal output by GOA1 is normal in the specific embodiment of the gate driving signal detection circuit shown in FIG. 4.

As shown in FIG. 6, when the gate driving signal detection circuit in the specific embodiment shown in FIG. 4 of the present disclosure is in operation.

During a blank time period t1, stages of the gate driving signal are high level, G1, G2, G3, G4 and Gn are high level, a clock signal output by the CLK is also high, and TN+1 is turned on, all N transistors except TN+1 included in the switch sub-circuit 11 are turned off, and at this time, the potential of the test signal line ST is charged to the high level;

During a output time period t2 of a first gate driving signal included in a scanning period, G1 is low level, and other stages of the gate driving signals except G1 are high level, and G2, G3, G4 and Gn are high level, the clock signal output by the CLK is low level, T1 is turned on, and N transistors other than T1 included in the switch sub-circuit 11 are turned off. At this time, the potential of the signal on the test signal line ST is discharged to the low level.

During a first interval time period t3 included in the scanning period, G1, G2, G3, G4 and Gn are high level, the clock signal output by the CLK is also high, and TN+1 is turned on, all N transistors except TN+1 included in the switch sub-circuit 11 are turned off, and at this time, the potential of the test signal line ST is charged to the high level;

During a output time period t4 of a second gate driving signal included in the scanning period, G2 is low level, and other stages of the gate driving signals except G2 are high level, and G1, G3, G4 and Gn are high level, the clock signal output by the CLK is low level, T2 is turned on, and N transistors other than T2 included in the switch sub-circuit 11 are turned off. At this time, the potential of the signal on the test signal line ST is discharged to the low level;

During a second interval time period t5 included in the scanning period, G1, G2, G3, G4 and Gn are high level, the clock signal output by the CLK is also high, and TN+1 is turned on, all N transistors except TN+1 included in the switch sub-circuit 11 are turned off, and at this time, the potential of the test signal line ST is charged to the high level;

Likewise, when Gn outputs a low level, other stages of the gate driving signals are high level, and a clock signal input by the CLK is low level, then Tn is turned on, and the potential of the signal in the test signal line ST is discharged to the low level; when stages of the gate driving signals are high level (there is no effective low level output), the clock signal input by the CLK is high level, then TN+1 is turned on, at this time the potential of the signal in the test signal line ST is charged to the high level.

Figure 7:
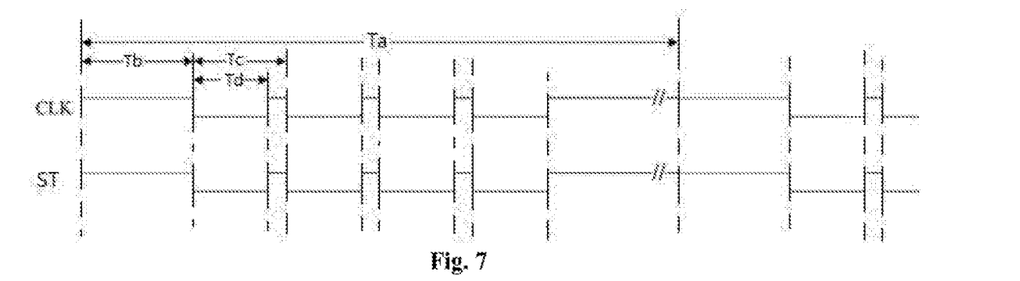
FIG. 7 is a timing diagram detected by an oscilloscope Osc when the gate driving signal output by each stage of the gate driving unit is normal in the specific embodiment of the gate driving signal detection circuit shown in FIG. 4 of the present disclosure.

In FIG. 7, t6 is an output time period of a third gate driving signal included in the scanning period, and t7 is a third interval time period included in the scanning period.

In a specific embodiment of the gate driving signal detection circuit shown in FIG. 4 of the present disclosure, by testing the test pad PAD with the pin test of the oscilloscope Osc, it is possible to detect the effective output pulse waveforms when each stage of the gate driving signal output by each stage of the gate driving unit is normal.

FIG. 7 is a timing diagram detected by the oscilloscope Osc when the gate driving signal output by each stage of the gate driving unit is normal in the specific embodiment of the gate driving signal detection circuit shown in FIG. 4 of the present disclosure.

In FIG. 7, duration of one frame is Ta, duration of the blank time period is Tb, time required to scan a row of gate lines is Tc, and duration of an output time period of a gate driving signal is Td. When a detection window of the oscilloscope Osc is adjusted to display a complete one-frame waveform on the test signal line ST, it could be seen that the waveform captured by the oscilloscope Osc is displayed as a complete pulse waveform, it could be determined that, at this time, output of each stage of the gate driving unit included in GOA1 is normal.

Figure 8:
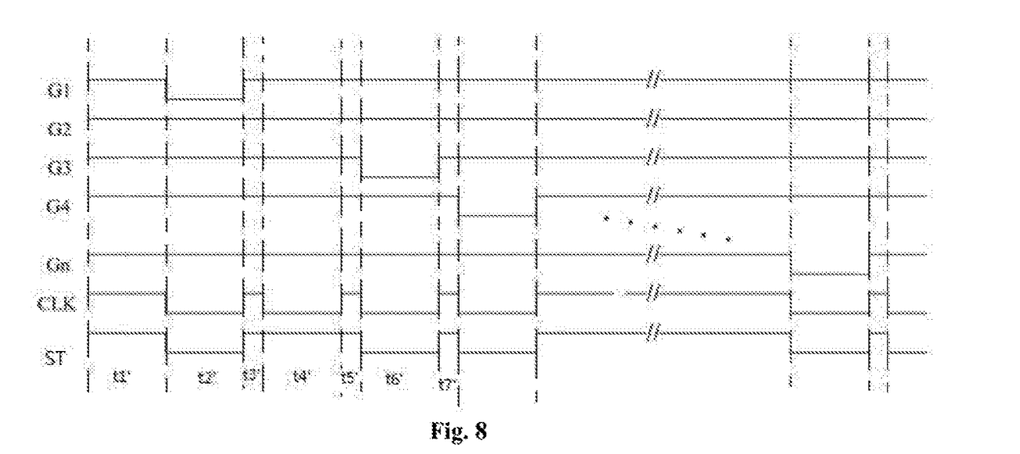
FIG. 8 is a timing diagram of each signal when the gate driving signal output by GOA1 has a fault type one in the specific embodiment of the gate driving signal detection circuit shown in FIG. 4.

FIG. 8 is a timing diagram of each signal when the gate driving signal output by GOA1 has a fault type one in the specific embodiment of the gate driving signal detection circuit shown in FIG. 4.

As shown in FIG. 8, when the gate driving signal detection circuit in the specific embodiment shown in FIG. 4 of the present disclosure is in operation.

During a blank time period t1', stages of the gate driving signals are high level, G1, G2, G3, G4 and Gn are high level, a clock signal output by the CLK is also high, and TN+1 is turned on, all N transistors except TN+1 included in the switch sub-circuit 11 are turned of, and at this time, the potential of the test signal line ST is charged to high level;

During a output time period t2' of a first gate driving signal included in a scanning period, G1 is low level, and other stages of the gate driving signals except G1 are high level, and G2, G3, G4 and Gn are high level, the clock signal output by the CLK is low level, T1 is turned on, and N transistors other than T1 included in the switch sub-circuit 11 are turned off. At this time, the potential of the signal on the test signal line ST is discharged to low level.

During a first interval time period t3' included in the scanning period, stages of the gate driving signal are high level, G1, G2, G3, G4 and Gn are high level, the clock signal output by the CLK is also high, and TN+1 is turned on, all N transistors except TN+1 included in the switch sub-circuit 11 are turned off, and at this time, the potential of the test signal line ST is charged to the high level;

During a output time period t4' of a second gate driving signal included in the scanning period, G2 is ineffective, so that G2 is high level (G2 should output the low level), and other stages of the gate driving signals except G2 are high level, and G1, G3, G4 and Gn are high level, the clock signal output by the CLK is low level, and T2 and all other switch transistors are turned off. At this time, the potential of the signal on the test signal line ST remains high, the potential of the signal on the ST within t4' indicates that G2 is ineffective and the corresponding second-stage gate driving unit is fault;

During a second interval time period t5' included in the scanning period, stage of the gate driving signals are high level, G1, G2, G3, G4 and Gn are high level, the clock signal output by the CLK is also high, and TN+1 is turned on, all N transistors except TN+1 included in the switch sub-circuit 11 are turned off, and at this time, the potential of the test signal line ST is charged to the high level;

During a output time period t6' of a third gate driving signal included in the scanning period, G3 is low level, and other stages of the gate driving signals except G3 are high level, and G1, G2, G4 and Gn are high level, the clock signal output by the CLK is low level, T3 is turned on, and all other switch transistors are turned off. At this time, the potential of the signal on the test signal line ST is discharged to the low level:

For example, during a third interval time period t7' included in the scanning period, stages of the gate driving signals are high level, G1, G2, G3, G4 and Gn are high level, the clock signal output by the CLK is also high, and TN+1 is turned on, all N transistors except TN+1 included in the switch sub-circuit 11 are turned off, and at this time, the potential of the test signal line ST is charged to the high level.

Thus, in a specific embodiment of the gate driving signal detection circuit shown in FIG. 4 of the present disclosure, by testing the test pad PAD with the pin test of the oscilloscope Osc, it is possible to detect a pulse waveform of the signal on the test signal line ST when the gate driving unit included in GOA1 has the fault type one.

Figure 9:
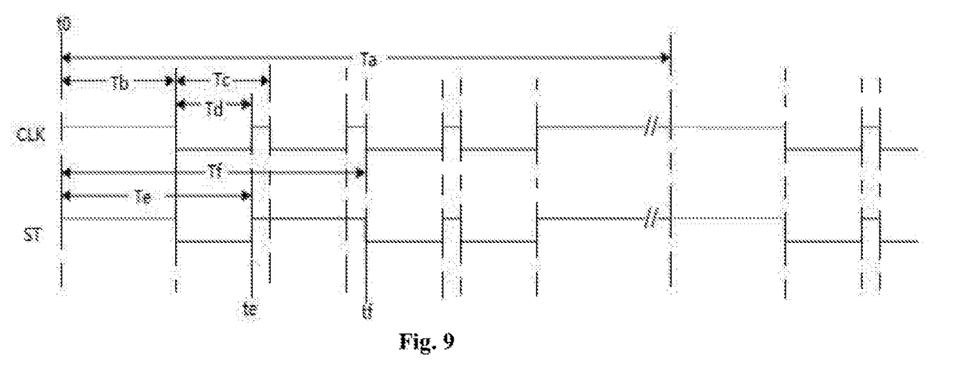
FIG. 9 is a timing diagram detected by the oscilloscope Osc when the gate driving unit has the fault type one in the specific embodiment of the gate driving signal detection circuit shown in FIG. 4 of the present disclosure.

FIG. 9 is a timing diagram detected by the oscilloscope Osc when the gate driving unit has the fault type one in the specific embodiment of the gate driving signal detection circuit shown in FIG. 4 of the present disclosure.

In FIG. 9, duration of one frame is Ta, duration of the blank time period is Tb, time required to scan a row of gate lines is Tc, and duration of an output time period of a gate driving signal is Td. At this time, when a detection window of the oscilloscope Osc is adjusted to display a complete one-frame waveform on the test signal line ST, it could be seen that the waveform captured by the oscilloscope Osc is displayed as a missing pulse waveform; the specific location of the fault gate driving unit may be calculated and accurately identified by measuring a time length from a start time t0 to a pulse waveform of a gate driving signal output by a gate driving unit that has a fault in a certain stage.

As shown in FIG. 9, the start time t0 is a start time of the blank time period. When the m-th stage gate driving unit included in GOA1 has fault, the duration between a fault start time to and the start time t0 is a first time Te, the duration between the fault end time tf and the start time t0 is a second time Tf, then Te=Tb+(m−2)×Tc+Td, Tf=Tb+m× Tc; conversely, when a missing pulse waveform of a certain stage is between the te and the tf, it indicates that the m-th stage gate driving has a fault (m is a positive integer, as could be seen from FIG. 9, in the embodiment corresponding to FIG. 9, m is equal to 2). Therefore, the gate driving signal detection circuit described in the embodiment of the present disclosure may effectively detect the gate driving signal output by each stage of the gate driving unit, accurately identify the specific location of the faulty gate driving unit, and has the advantages of small space, high reliability, easy operation, and high detection efficiency.

Figure 10:
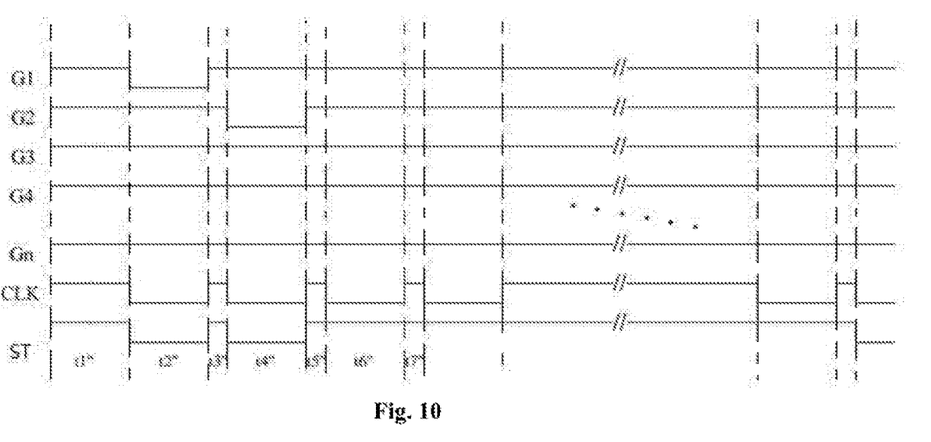
FIG. 10 is a timing diagram of each signal when the gate driving signal output by GOA1 has a fault type two in the specific embodiment of the gate driving signal detection circuit shown in FIG. 4.

FIG. 10 is a timing diagram of each signal when the gate driving signal output by GOA1 has a fault type two in the specific embodiment of the gate driving signal detection circuit shown in FIG. 4.

As shown in FIG. 10, when the gate driving signal detection circuit in the specific embodiment shown in FIG. 4 of the present disclosure is in operation.

During a blank time period t1", stages of the gate driving signals are high level, G1, G2, G3, G4 and Gn are high level, a clock signal output by the CLK is also high, and TN+1 is turned on, all N transistors except TN+1 included in the switch sub-circuit 11 are turned off, and at this time, the potential of the test signal line ST is charged to the high level;

During a output time period t2" of a first gate driving signal included in a scanning period, G1 is low level, and other stages of the gate driving signals except G1 are high level, and G2, G3, G4 and Gn are high level, the clock signal output by the CLK is low level, T1 is turned on, and N transistors other than T1 included in the switch sub-circuit 11 are turned off. At this time, the potential of the signal on the test signal line ST is discharged to the low level.

During a first interval time period t3" included in the scanning period, stages of the gate driving signals are high level, G1, G2, G3, G4, Gn and the clock signal output by the CLK are also high, and TN+1 is turned on, all N transistors except TN+1 included in the switch sub-circuit 11 are turned off, and at this time, the potential of the test signal line ST is charged to the high level;

During a output time period t4" of a second gate driving signal included in the scanning period, G2 is low level, and other stages of the gate driving signals except G2 are high level, and G1, G3, G4 and Gn are high level, the clock signal output by the CLK is low level, T2 is turned on, and N transistors other than T2 included in the switch sub-circuit 11 are turned off. At this time, the potential of the signal on the test signal line ST is discharged to the low level;

During a second interval time period t5" included in the scanning period, stages of the gate driving signals are high level, G1, G2, G3, G4 and Gn are high level, the clock signal output by the CLK is also high, and TN+1 is turned on, all N transistors except TN+1 included in the switch sub-circuit 11 are turned off, and at this time, the potential of the test signal line ST is charged to the high level;

During a output time period t6" of a second gate driving signal included in the scanning period, G3 is ineffective, so that G3 is high level (G3 should output the low level), and other stages of the gate driving signals except G3 are high level, and G1, G2, G4 and Gn are high level, the clock signal output by the CLK is low level, and T3 and all other switch transistors are turned off. At this time, the potential of the signal on the test signal line ST remains high, the potential of the signal on the ST within t6" indicates that G3 is ineffective and the corresponding third-stage gate driving unit is fault;

During a second interval time period t7" included in the scanning period, stages of the gate driving signals are high level, G1, G2, G3, G4 and Gn are high level, the clock signal output by the CLK is also high, and TN+1 is turned on, all N transistors except TN+1 included in the switch sub-circuit 11 are turned off, and at this time, the potential of the test signal line ST is charged to the high level;

Likewise, the potentials of the signals on the test signal line ST remain high until a output time period of the first gate driving signal included in the scanning period in the next frame time comes, G1 becomes low, and other stages of the gate driving signals are high level, the clock signal input by the CLK is low level, T1 is turned on again, at this time, the potential of the test signal line ST is discharged to the low level, and the action of the previous frame is repeated.

Thus, in a specific embodiment of the present disclosure, by testing the test pad PAD with the pin test of the oscilloscope Osc, it is possible to detect a pulse waveform of the signal on the test signal line ST when the gate driving unit included in GOA1 has a fault type two.

Figure 11:
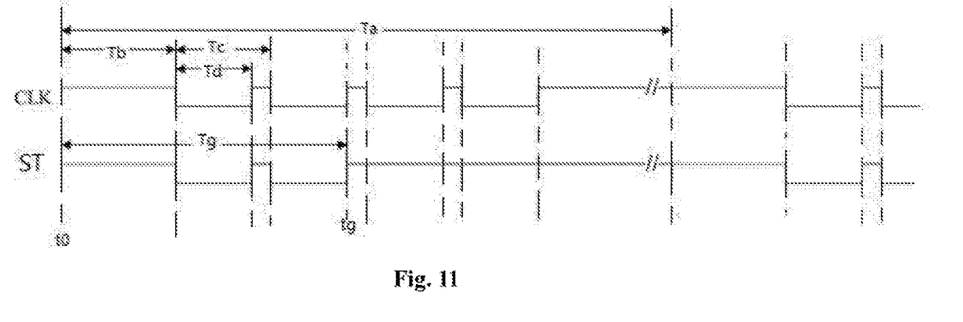
FIG. 11 is a timing diagram detected by the oscilloscope Osc when the gate driving unit has the fault type two in the specific embodiment of the gate driving signal detection circuit shown in FIG. 4 of the present disclosure.

FIG. 11 is a timing diagram detected by the oscilloscope Osc when the gate driving unit has the fault type two in the specific embodiment of the gate driving signal detection circuit shown in FIG. 4 of the present disclosure.

In FIG. 11, the start time t0 is a start time of the blank time period, duration of one frame is Ta, duration of the blank time period is Tb, time required to scan a row of gate lines is Tc, and duration of a output time period of a gate driving signal is Td. At this time, when a detection window of the oscilloscope Osc is adjusted to display a complete one-frame waveform on the test signal line ST, it could be seen that the waveform captured by the oscilloscope Osc is displayed as a missing pulse waveform; the specific location of the fault gate driving unit may be calculated and accurately identified by measuring a time length from the start time t0 to a pulse waveform of a gate driving signal output by a gate driving unit that starts to have a fault in a certain stage.

As shown in FIG. 11, for example, the m-th GOA circuit unit has a fault, duration between a fault start time tg and the start time t0 is a third time Tg;

Tg=Tb+(m−2)×Tc+Td, conversely, when a pulse waveform of a missing stage of the gate driving signal and all subsequent fault gate driving signals are after the tg, it indicates the m-th stage gate driving unit has a fault (m is a positive integer, in the embodiment shown in FIG. 11, m is equal to 3).

Therefore, the gate driving signal detection circuit described in the embodiment of the present disclosure may effectively detect the gate driving signal output by each stage of the gate driving units, accurately identify the specific location of the faulty gate driving unit, and has the advantages of small space, high reliability, easy operation, and high detection efficiency.

As above, the difference between the fault type one and the fault type two is that, when the fault type of the m-th stage gate driving unit is the fault type one, only during a output time period of the m-th gate driving signal, the potentials of the signals on the test signal line ST is an ineffective level; when the fault type of the m-th stage gate driving unit is the fault type two, during the output time period of the m-th gate driving signal and a time period after the output time period of the m-th gate driving signal included in the current scanning period, the potentials of the signals on the test signal line ST are the ineffective levels.

Figure 12:
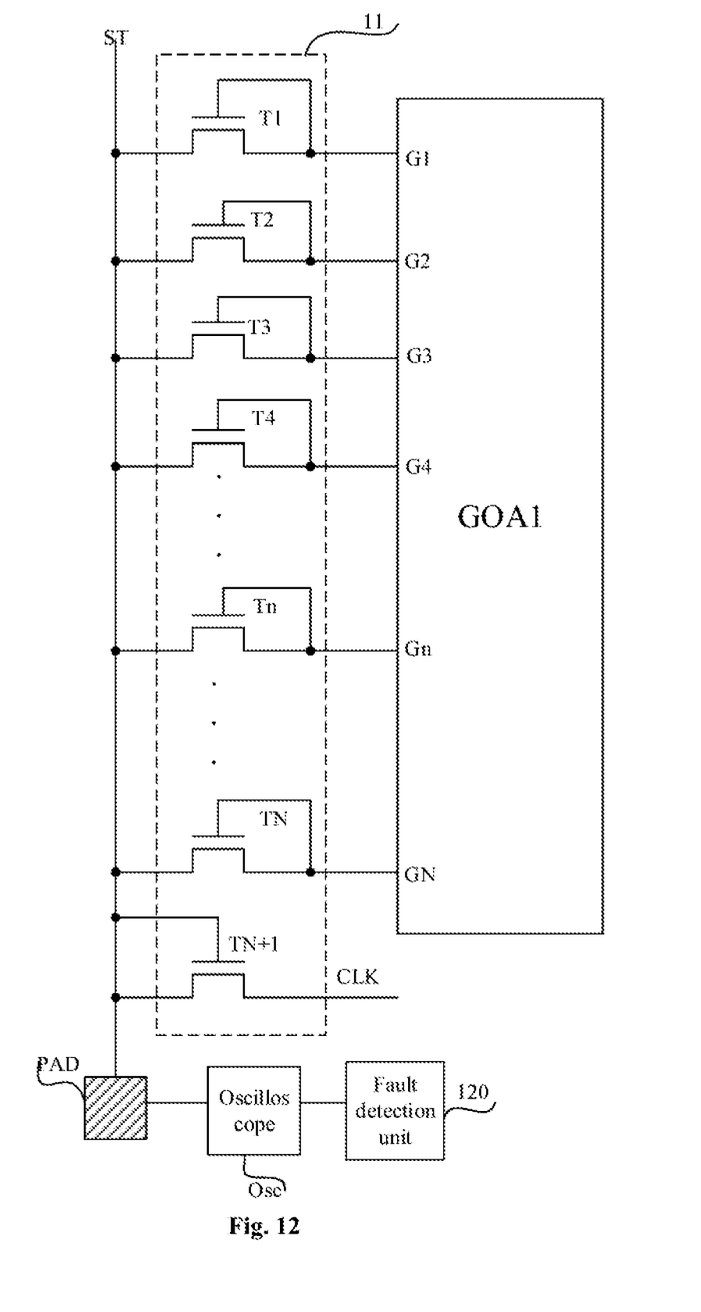
FIG. 12 is a circuit diagram of another specific embodiment of a gate driving signal detection circuit described in the present disclosure.

As shown in FIG. 12, another specific embodiment of the gate driving signal detection circuit described in the present disclosure includes a switch sub-circuit 11, a test signal line ST, and a detection sub-circuit;

The detection sub-circuit includes a test pad PAD, an oscilloscope Osc, and a fault detection unit 120, wherein, The test pad PAD is electrically connected to the test signal line ST;

The oscilloscope Osc is electrically connected to the test pad PAD, and is configured to display a waveform of the signal on the test signal line ST;

The fault detection unit 120 is connected to the oscilloscope Osc, and is configured to detect the fault of the gate driving unit according to the waveform;

The switch sub-circuit 11 includes N+1 switch transistors, N is the number of stages of the gate driving signal output terminals in the gate driving circuit; N is a positive integer;

In FIG. 12, a reference numeral T1 is a first switch transistor included in the switch sub-circuit 11, a reference numeral T2 is a second switch transistor included in the switch sub-circuit 11, a reference numeral T3 is a third switch transistor included in the switch sub-circuit, a reference number T4 is a fourth switch transistor included in the switch sub-circuit 11, a reference number Tn is an n-th switch transistor included in the switch sub-circuit 11, a reference number TN is an N-th switch transistor included in the switching sub-circuit 11, and a reference number TN+1 is an (N+1)-th switch transistor included in the switch sub-circuit 11; N is a positive integer, and n is a positive integer less than or equal to N;

In FIG. 12, the gate driving circuit is labeled GOA1, a first-stage gate driving signal output by GOA1 is labeled G1, a second-stage gate driving signal output by GOA1 is labeled G2, a third-stage gate driving signal output by GOA1 is labeled G3, a fourth-stage gate driving signal output by GOA1 is labeled G4, an n-th stage gate driving signal output by GOA1 is labeled Gn, and an N-th stage gate driving signal output by GOA1 is labeled GN.

A gate of T1 and a drain of T1 are both connected to G1, and a source of T1 is connected to the test signal line ST;

A gate of T2 and a drain of T2 are both connected to G2, and a source of T2 is connected to the test signal line ST;

A gate of T3 and a drain of T3 are both connected to G3, and a source of T3 is connected to the test signal line ST;

A gate of T4 and a drain of T4 are both connected to G4, and a source of T4 is connected to the test signal line ST;

A gate of Tn and a drain of Tn are both connected to Gn, and a source of Tn is connected to the test signal line ST;

A gate of TN and a drain of TN are both connected to GN, and a source of TN is connected to the test signal line ST;

A gate of TN+1 and a source of TN+1 are both connected to the test signal line ST, and a drain of TN+1 is connected to the clock signal line CLK.

In the embodiment shown in FIG. 12, all transistors are described as examples of the n-type transistors, but not limited thereto. In the specific embodiment shown in FIG. 12, the effective level is a high level, and the ineffective level is a low level.

Figure 13:
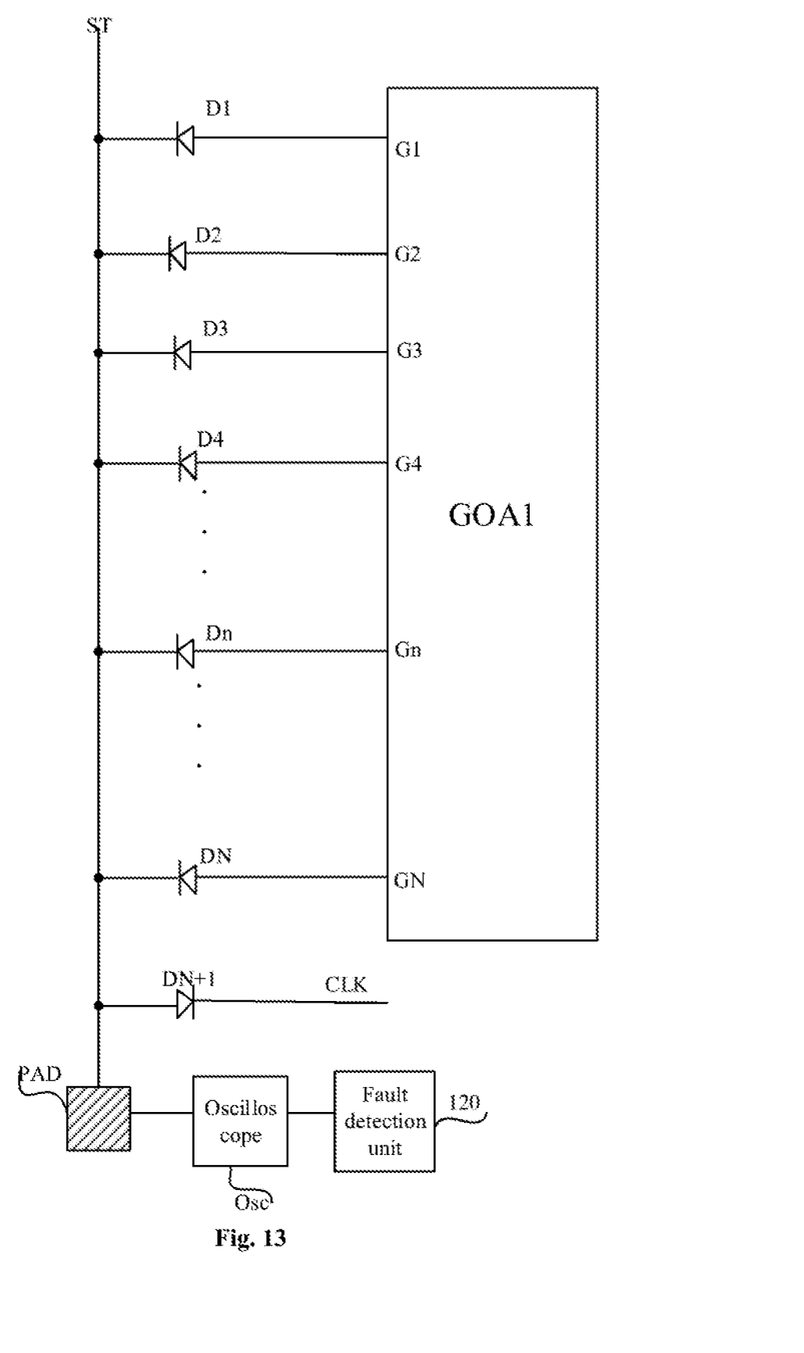
FIG. 13 is an equivalent circuit diagram of the specific embodiment of the gate driving signal detection circuit shown in FIG. 12 of the present disclosure.

FIG. 13 is an equivalent circuit diagram of FIG. 12, wherein a first diode D1 is equivalent to T1, a second diode D2 is equivalent to T2, D3 is equivalent to T3, D4 is equivalent to T4, and an n-th diode Dn is equivalent to Tn, an N-th diode DN is equivalent to TN, and an (N+1)-th diode DN+1 is equivalent to TN+1.

The gate driving signal detection method described in the embodiment of the present disclosure is applied to the gate driving signal detection circuit described above, the scanning period includes a plurality of output time periods of gate driving signal which are sequentially arranged, the output time period of the gate driving signal corresponds to each stage of the gate driving signal; during the scanning period, the interval time period is set between output time periods of the two adjacent gate driving signals; the blank time period is set between the two adjacent scanning periods.

The gate driving signal detection method includes:

during the blank time period and the interval time period, the switch sub-circuit controlling the writing of the clock signal output by the clock signal line into the test signal line, so as to reset a potential of the test signal line to an ineffective level; the switch sub-circuit controlling to disconnect a connection between a corresponding stage of the gate driving signal output terminal and the test signal line;

during a output time period of a corresponding gate driving signal included in the scanning period, the switch sub-circuit controlling to disconnect a connection between the clock signal line and the test signal line, when a potential of a corresponding stage of the gate driving signal is an effective level, the switch sub-circuit controlling to establish a connection between the corresponding stage of the gate driving signal output terminal and the test signal line, so that a potential of the signal in the test signal line is an effective level; when the potential of the corresponding stage of the gate driving signal is an ineffective level, the switch sub-circuit controlling to disconnect the connection between the corresponding stage of the gate driving signal output terminal and the test signal line, so that a potential of the signal in the test signal line is an ineffective level.

The gate driving signal detection method described in the embodiment of the present disclosure only needs to use a single test signal line, a single clock signal line, and the switch sub-circuit, to effectively detect the gate driving signal output by each stage of the gate driving unit, that is, it may be determined whether the each stage of the gate driving unit has a fault according to the potential of the signal on the test signal line during a output time period of each gate driving signal.

The gate driving signal detection method described in the embodiment of the present disclosure may accurately identify the specific location of the faulty gate driving unit while effectively detecting the gate driving signal, and has the advantages of small space, high reliability, easy operation, and high detection efficiency.

In some embodiments, the gate driving signal detection circuit may further include a detection sub-circuit, the gate driving signal detection method further includes: the detection sub-circuit detecting a signal on the test signal line, and detecting a fault of the gate driving unit according to the signal on the test signal line.

Specifically, the detection sub-circuit may include a test pad, an oscilloscope, and a fault detection unit, the test pad is electrically connected to the test signal line; the step of detection sub-circuit detecting a signal on the test signal line, and detecting the fault of the gate driving unit according to the signal on the test signal line includes:

displaying a waveform of the signal on the test signal line through the oscilloscope;

detecting the fault of the gate driving unit through the fault detection unit according to the waveform.

The display device described in the embodiment of the present disclosure includes the gate driving signal detection circuit described above.

Specifically, the display device described in the embodiment of the present disclosure may further include a display substrate and a gate driving circuit disposed on the display substrate;

The gate driving circuit includes multiple stages of the gate driving units; the gate driving unit includes a gate driving signal output terminal;

The switch sub-circuits in the gate driving signal detection circuit are connected to multiple stages of the gate driving signal output terminals included in the gate driving circuit, respectively.

The display device provided in the embodiments of the present disclosure may be any product or component having a display function, such as a mobile phone, a tablet computer, a television, a display, a notebook computer, a digital photo frame, a navigator, and the like.

The descriptions above are preferred embodiments of the disclosure, it should be noted that the improvements and the embellishments within the scope of the tenets of the disclosure shall be within the protection range of the disclosure to those of ordinary skill in the art.

What is claimed is:

1. A gate driving signal detection circuit, applied to a gate driving circuit, comprising multiple stages of gate driving sub-circuits, wherein each gate driving sub-circuit comprises a gate driving signal output terminal, the gate driving signal detection circuit comprises a switch sub-circuit and a test signal line, the test signal line is connected to a clock signal line and multiple stages of gate driving signal output terminals respectively through the switch sub-circuit, wherein, during a blank time period set between two adjacent scanning periods and an interval time period between output time periods of two adjacent gate driving signals set in the scanning period, the switch sub-circuit controls writing of a clock signal output by the clock signal line into the test signal line;

during a output time period of each stage of gate driving signal, when a potential of the gate driving signal is an effective level, the switch sub-circuit controls to establish a connection between the corresponding gate driving signal output terminal and the test signal line, and when the potential of the gate driving signal is an ineffective level, the switch sub-circuit controls to disconnect the connection between the corresponding gate driving signal output terminal and the test signal line, wherein the switch sub-circuit comprises N+1 switch transistors, N is the number of stages of the gate driving signal output terminal in the gate driving circuit, and N is a positive integer;

a gate of an n-th switch transistor and a first electrode of the n-th switch transistor are both connected to an n-th stage gate driving signal output terminal, a second electrode of the n-th switch transistor is connected to the test signal line; n is a positive integer less than or equal to N;

a gate of an (N+1)-th switch transistor and a second electrode of the (N+1)-th switch transistor are both connected to the test signal line, a first electrode of the (N+1)-th switch transistor is connected to the clock signal line.

2. The gate driving signal detection circuit according to claim 1, wherein the effective level is a low level, the ineffective level is a high level, the N+1 switch transistors are all p-type transistors; or, the effective level is a high level, the ineffective level is a low level, the N+1 switch transistors are all n-type transistors.

3. A display device, comprising the gate driving signal detection circuit according to claim 1.

4. The gate driving signal detection circuit according to claim 1, further comprising a detection sub-circuit; wherein, the detection sub-circuit is connected to the test signal line to detect a signal on the test signal line, and detects a fault of the gate driving sub-circuit according to the signal on the test signal line.

5. The gate driving signal detection circuit according to claim 4, wherein the detection sub-circuit comprises a test pad, an oscilloscope, and a fault detection sub-circuit, wherein, the test pad is electrically connected to the test signal line;

the oscilloscope is electrically connected to the test pad, and is configured to display a waveform of the signal on the test signal line;

the fault detection sub-circuit detects the fault of the gate driving sub-circuit according to the waveform.

6. A gate driving signal detection method, applied to the gate driving signal detection circuit according to claim 1, wherein, the scanning period comprises a plurality of output time periods of gate driving signal which are sequentially arranged, the output time period of the gate driving signal corresponds to each stage of the gate driving signal;

during the scanning period, the interval time period is set between the output time periods of the two adjacent gate driving signals; the blank time period is set between the two adjacent scanning periods; the gate driving signal detection method comprises:

during the blank time period and the interval time period, controlling, by the switch sub-circuit, the writing of the clock signal output by the clock signal line into the test signal line and disconnecting a connection between a corresponding stage of the gate driving signal output terminal and the test signal line;

during a output time period of a corresponding gate driving signal comprised in the scanning period, controlling, by the switch sub-circuit, to disconnect a connection between the clock signal line and the test signal line, wherein, when a potential of a corresponding stage of the gate driving signal is an effective level, the switch sub-circuit controls to establish a connection between the corresponding stage of the gate driving signal output terminal and the test signal line, when the potential of the corresponding stage of the gate driving signal is an ineffective level, the switch sub-circuit controls to disconnect the connection between the corresponding stage of the gate driving signal output terminal and the test signal line.

7. The gate driving signal detection method according to claim 6, wherein, the gate driving signal detection circuit further comprises a detection sub-circuit, the gate driving signal detection method further comprises: detecting, by the detection sub-circuit, a signal on the test signal line and a fault of the gate driving sub-circuit according to the signal on the test signal line.

8. The gate driving signal detection method according to claim 7, wherein, the detection sub-circuit comprises a test pad, an oscilloscope, and a fault detection sub-circuit, the test pad is electrically connected to the test signal line; the step of detecting, by the detection sub-circuit, a signal on the test signal line and a fault of the gate driving sub-circuit according to the signal on the test signal line comprises:

displaying a waveform of the signal on the test signal line by the oscilloscope;

detecting, by the fault detection sub-circuit, the fault of the gate driving sub-circuit according to the waveform.

9. The gate driving signal detection method according to claim 8, wherein, the detecting, by the fault detection sub-circuit, the fault of the gate driving sub-circuit according to the waveform comprises:

determining the fault gate driving sub-circuit by a time length from a measurement start time to a missing pulse waveform.

10. A gate driving signal detection method, applied to a gate driving signal detection circuit, wherein the gate driving signal detection circuit is applied to a gate driving circuit and comprises multiple stages of gate driving sub-circuits, wherein each gate driving sub-circuit comprises a gate driving signal output terminal, the gate driving signal detection circuit comprises a switch sub-circuit and a test signal line, the test signal line is connected to a clock signal line and multiple stages of gate driving signal output terminals respectively through the switch sub-circuit, wherein, during a blank time period set between two adjacent scanning periods and an interval time period between output time periods of two adjacent gate driving signals set in the scanning period, the switch sub-circuit controls writing of a clock signal output by the clock signal line into the test signal line;

during a output time period of each stage of gate driving signal, when a potential of the gate driving signal is an effective level, the switch sub-circuit controls to establish a connection between the corresponding gate driving signal output terminal and the test signal line, and when the potential of the gate driving signal is an ineffective level, the switch sub-circuit controls to disconnect the connection between the corresponding gate driving signal output terminal and the test signal line, wherein, the scanning period comprises a plurality of output time periods of gate driving signal which are sequentially arranged, the output time period of the gate driving signal corresponds to each stage of the gate driving signal;

during the scanning period, the interval time period is set between the output time periods of the two adjacent gate driving signals; the blank time period is set between the two adjacent scanning periods; the gate driving signal detection method comprises:

during the blank time period and the interval time period, controlling, by the switch sub-circuit, the writing of the clock signal output by the clock signal line into the test signal line and disconnecting a connection between a corresponding stage of the gate driving signal output terminal and the test signal line;

during a output time period of a corresponding gate driving signal comprised in the scanning period, controlling, by the switch sub-circuit, to disconnect a connection between the clock signal line and the test signal line, wherein, when a potential of a corresponding stage of the gate driving signal is an effective level, the switch sub-circuit controls to establish a connection between the corresponding stage of the gate driving signal output terminal and the test signal line, when the potential of the corresponding stage of the gate driving signal is an ineffective level, the switch sub-circuit controls to disconnect the connection between the corresponding stage of the gate driving signal output terminal and the test signal line.

11. The gate driving signal detection method according to claim 10, wherein, the gate driving signal detection circuit further comprises a detection sub-circuit, the gate driving signal detection method further comprises: detecting, by the detection sub-circuit, a signal on the test signal line and a fault of the gate driving sub-circuit according to the signal on the test signal line.

12. The gate driving signal detection method according to claim 11, wherein, the detection sub-circuit comprises a test pad, an oscilloscope, and a fault detection sub-circuit, the test pad is electrically connected to the test signal line; the step of detecting, by the detection sub-circuit, a signal on the test signal line and a fault of the gate driving sub-circuit according to the signal on the test signal line comprises:

displaying a waveform of the signal on the test signal line by the oscilloscope;

detecting, by the fault detection sub-circuit, the fault of the gate driving sub-circuit according to the waveform.

13. The gate driving signal detection method according to claim 12, wherein, the detecting, by the fault detection sub-circuit, the fault of the gate driving sub-circuit according to the waveform comprises:

determining the fault gate driving sub-circuit by a time length from a measurement start time to a missing pulse waveform.

\* \* \* \* \*